United States Patent
Cho

(10) Patent No.: US 9,807,881 B2
(45) Date of Patent: Oct. 31, 2017

(54) SEMICONDUCTOR DEVICE

(71) Applicant: SAMSUNG ELECTRONICS CO., LTD., Suwon-si (KR)

(72) Inventor: Young-Jin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/854,055

(22) Filed: Sep. 15, 2015

(65) Prior Publication Data
US 2016/0007465 A1    Jan. 7, 2016

Related U.S. Application Data

(63) Continuation of application No. 13/476,609, filed on May 21, 2012, now Pat. No. 9,159,657.

(30) Foreign Application Priority Data

Aug. 4, 2011   (KR) .................... 10-2011-0077822

(51) Int. Cl.
| | |
|---|---|
| H05K 1/18 | (2006.01) |
| H01L 23/48 | (2006.01) |
| H01L 23/498 | (2006.01) |
| G09G 3/3225 | (2016.01) |
| G09G 3/36 | (2006.01) |

(Continued)

(52) U.S. Cl.
CPC ........... *H05K 1/181* (2013.01); *G09G 3/3225* (2013.01); *G09G 3/3648* (2013.01); *H01L 23/498* (2013.01); *G09G 2300/04* (2013.01); *H01L 23/15* (2013.01); *H01L 23/48* (2013.01); *H01L 23/481* (2013.01); *H01L 23/49838* (2013.01); *H01L 23/50* (2013.01); *H01L 23/52* (2013.01); *H01L 24/05* (2013.01); *H01L 24/06* (2013.01); *H01L 24/16* (2013.01); *H01L 2224/0401* (2013.01); *H01L 2224/05567* (2013.01); *H01L 2224/06155* (2013.01); *H01L 2224/131* (2013.01); *H01L 2224/16237* (2013.01); *H01L 2924/00014* (2013.01)

(58) Field of Classification Search
CPC ....... H05K 1/181; H01L 23/528; H01L 23/48; H01L 23/481; H01L 23/49838; H01L 23/50; H01L 23/52
See application file for complete search history.

(56) References Cited

U.S. PATENT DOCUMENTS

| | | |
|---|---|---|
| 4,833,620 A | 5/1989 | Takahashi |
| 4,962,058 A | 10/1990 | Cronin et al. |

(Continued)

FOREIGN PATENT DOCUMENTS

| | | | |
|---|---|---|---|
| JP | 2003-036038 A | | 2/2003 |
| JP | 2003036038 A | * | 2/2003 |

(Continued)

*Primary Examiner* — David Zarneke
(74) *Attorney, Agent, or Firm* — Sughrue Mion, PLLC

(57) ABSTRACT

A semiconductor device includes a semiconductor chip which includes a first circuit and a second circuit that are spaced apart from each other, without internal wirings electrically connecting the first circuit and the second circuit to each other, a substrate on which the semiconductor chip is disposed, and substrate wirings that are arranged on the substrate and electrically connect the first circuit and the second circuit to each other.

19 Claims, 8 Drawing Sheets

(51) Int. Cl.
  *H01L 23/52* (2006.01)
  *H01L 23/50* (2006.01)
  *H01L 23/00* (2006.01)
  *H01L 23/15* (2006.01)

(56) References Cited

U.S. PATENT DOCUMENTS

| | | |
|---|---|---|
| 7,687,896 B2 | 3/2010 | Shibata |
| 2011/0084758 A1 | 4/2011 | Shibata et al. |
| 2014/0332930 A1 | 11/2014 | Kamiya |

FOREIGN PATENT DOCUMENTS

| | | |
|---|---|---|
| JP | 2003-100982 A | 4/2003 |
| KR | 10-0254871 B1 | 5/2000 |

\* cited by examiner

SEMICONDUCTOR DEVICE

CROSS-REFERENCE TO RELATED APPLICATION

This application is a Continuation of U.S. patent application Ser. No. 13/476,609, filed on May 21, 2012, which claims priority from Korean Patent Application No. 2011-0077822, filed on Aug. 4, 2011 in the Korean Intellectual Property Office, the disclosure of which is incorporated by reference herein in its entirety.

BACKGROUND

1. Field

Apparatuses, devices, and articles of manufacture consistent with exemplary embodiments relate to a semiconductor device

2. Description of the Related Art

Chip On Glass (COG) technology, which mounts a semiconductor device, particularly a semiconductor chip of a driver integrated circuit (IC) or the like, on an insulating substrate that constitutes an image display apparatus, has been widely used. Recently, with the miniaturization of an electronic device, the size of a semiconductor chip that is mounted on a substrate is gradually decreased, and such decrease of the chip size causes the decrease of the width of the wiring that is formed inside the chip and the decrease of the margin for routing the wiring. Since the width of the wiring and the routing margin of the wiring are decreased, wire resistance may be increased, and a signal interference phenomenon may occur.

In order to counteract the increase of the wire resistance, techniques of forming additional wiring or increasing the thickness of the wiring may be adopted, but such techniques cause the increase of production costs and the deterioration of yield.

SUMMARY

Exemplary embodiments provide a semiconductor device which can reduce the wire resistance and the signal interference phenomenon without increasing the size of a semiconductor chip.

According to an aspect of an exemplary embodiment, there is provided a semiconductor device including a semiconductor chip which includes a first circuit and a second circuit that are spaced apart from each other, without internal wirings electrically connecting the first circuit and the second circuit to each other, a substrate on which the semiconductor chip is disposed, and substrate wirings that are arranged on the substrate and electrically connect the first circuit and the second circuit to each other.

According to an aspect of another exemplary embodiment, there is provided a semiconductor device including a semiconductor chip comprising a first internal wiring, a first connection pad that is electrically connected to the first internal wiring and exposed to an outside of the semiconductor chip, and a first input pad that is spaced apart from the first connection pad; a substrate on which the semiconductor chip is disposed; and a first substrate wiring that is arranged on the substrate and electrically connects the first connection pad and the first input pad to each other.

BRIEF DESCRIPTION OF THE DRAWING

The above and/or other aspects will be more apparent from the following detailed description taken in conjunction with the accompanying drawings, in which.

DETAILED DESCRIPTION

Figure 1:
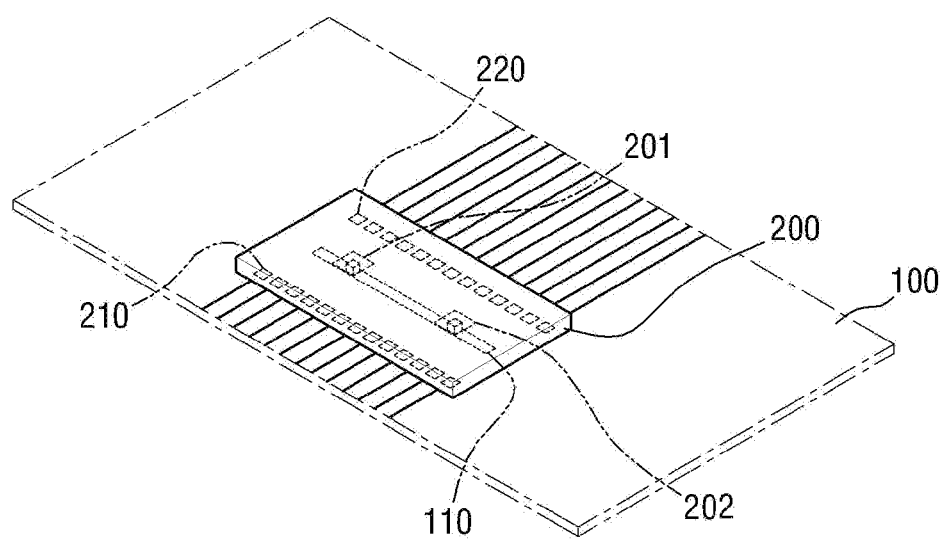
FIG. 1 is a perspective view explaining a semiconductor device according to a first exemplary embodiment.

Exemplary embodiments will now be described more fully hereinafter with reference to the accompanying drawings, in which exemplary embodiments are shown. The inventive concept may, however, be embodied in different forms and should not be construed as limited to the exemplary embodiments set forth herein. Rather, these exemplary embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plurality of, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which exemplary embodiments are shown. Thus, the profile of an exemplary view may be modified according to manufacturing techniques and/or allowances. That is, the exemplary embodiments are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Figure 2:
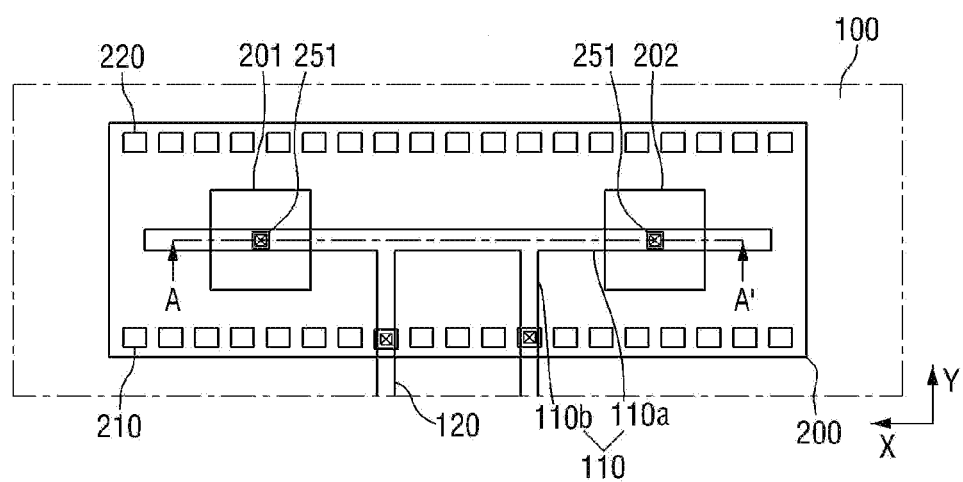
FIG. 2 is a layout diagram of a part of a substrate on which a semiconductor chip is mounted in a semiconductor device according to the first exemplary embodiment.
Figure 3:
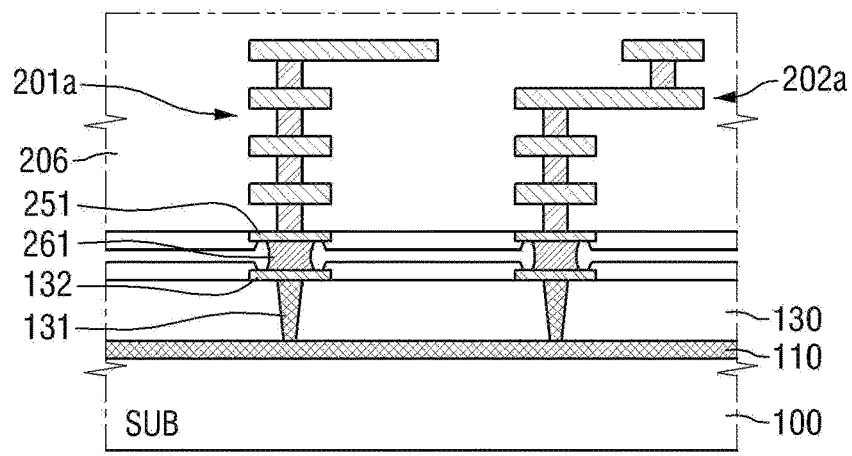
FIG. 3 is a cross-sectional view cut along line A-A' in FIG. 2.
Figure 4:
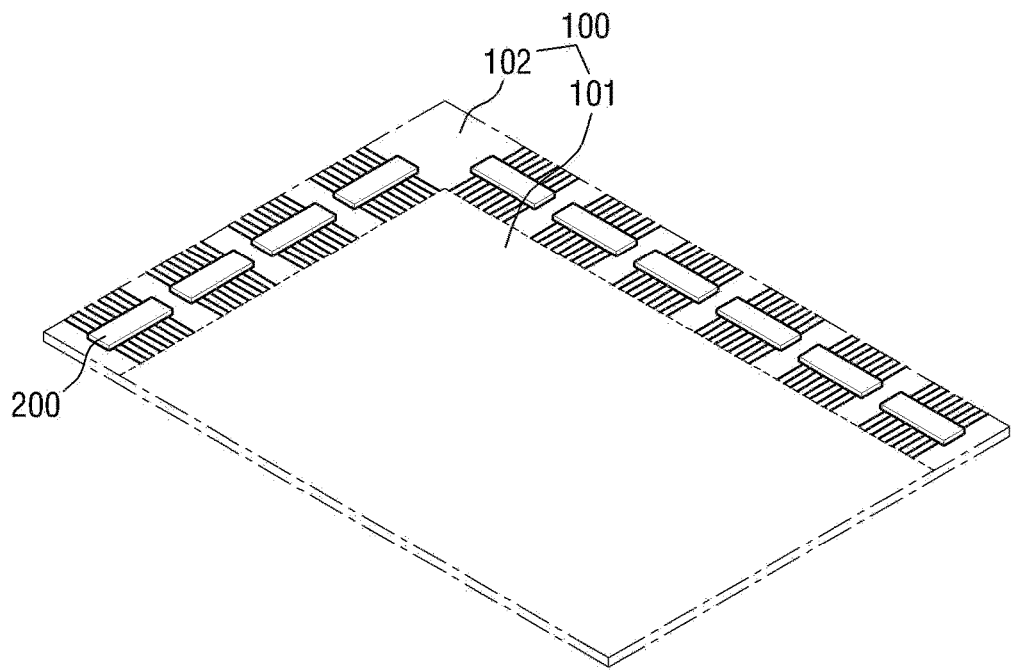
FIG. 4 is a view schematically illustrating a semiconductor device mounted with a semiconductor chip according to the first exemplary embodiment.

Hereinafter, a semiconductor device according to a first exemplary embodiment will be described in detail with reference to FIGS. 1 to 4. FIGS. 1 and 4 are perspective views explaining a semiconductor device according to the first exemplary embodiment, and FIG. 2 is a layout diagram of a part of a substrate on which a semiconductor chip is mounted in a semiconductor device according to the first exemplary embodiment. FIG. 3 is a cross-sectional view cut along line A-A' in FIG. 2. FIGS. 1 and 2 illustrate a semiconductor chip and only a part of a substrate on which a semiconductor chip is mounted.

Referring to FIGS. 1 to 4, a semiconductor device according to the first exemplary embodiment includes a substrate 100, a semiconductor chip 200, a substrate wiring 110, an external wiring 120, and the like.

The substrate 100 may be an insulating substrate, and specifically, may be a transparent insulating substrate. For example, the substrate 100 may be made of quartz, ceramic, plastic, or the like. Further, the substrate 100 may be a flexible substrate. On the other hand, the substrate 100 may be a semiconductor substrate, and for example, may include Si, Ge, SiGe, GaP, GaAs, SiC, InAs, and InP. A P-type substrate or an N-type substrate may be used as the semiconductor substrate, and the substrate 100 may include P-type well or N-type well on which p-type or n-type impurities are spread.

The semiconductor chip 200 is mounted on the substrate 100, and includes a first circuit 201, a second circuit 202, an input pad 210 and an output pad 220. The semiconductor chip 200 includes a long side and a short side, and referring to FIG. 2, the long side direction is defined as an X direction and the short side direction is defined as a Y direction. The input pad 210 is formed to be positioned in an end portion of the long-side of the semiconductor chip 200 and to be exposed to outside. A supply voltage VDD, a ground voltage VSS, and a clock signal CPV may be input to the semiconductor chip 200 through the input pad 210. The first circuit 201 and the second circuit 202 may generate signals that are used in the semiconductor device in response to signals input through the input pad 210, and may be diverse circuits or devices formed inside the semiconductor chip 200. For example, the first circuit 201 and the second circuit 202 may be, but are not limited to, transistors, diodes, or wiring structures formed inside the semiconductor chip 200. The first circuit 201 and the second circuit 202 are formed to be spaced apart from each other, and wiring for electrically connecting the first circuit 201 and the second circuit 202 is not formed inside the semiconductor chip 200. The output pad 220 is positioned in an end portion of the long side of the semiconductor chip 200 that is opposite the input pad 210. The signals generated from the first circuit 201 and the second circuit 202 are output to the outside through the output pad 220. A plurality of input pads 210 and a plurality of output pads 220 may be formed.

The substrate wiring 110 is formed on the substrate 100. The first circuit 201 and the second circuit 202 are electrically connected to each other through the substrate wiring 110 formed on the substrate 100. That is, the substrate wiring 110 for connecting the first circuit 201 and the second circuit 202 to each other is not formed inside the semiconductor chip 200, and the first circuit 201 and the second circuit 202 are electrically connected to each other by the substrate wiring 110 arranged on the substrate 100. Further, as illustrated in FIG. 2, the substrate wiring 110 is connected to at least one of a plurality of input pads 210 to deliver the signal input to the input pad 210 to the first circuit 201 and the second circuit 202. The substrate wiring 110 may be formed of, but is not limited to, Indium Tin Oxide (ITO) or Indium Zinc Oxide (IZO).

Referring to FIG. 2, the external wiring 120 is formed on the substrate 100 at one side of the semiconductor chip 200, and is electrically connected to the input pad 210. The external wiring is extended from the input pad 210 to form the substrate wiring 110. That is, the external wiring 120 that is formed on the substrate 100 at one side of the semiconductor chip 200 is connected to the input pad 210 and is extended from the input pad 210 to form the substrate wiring 110 that electrically connects the first circuit 201 and the second circuit 202 to each other. FIG. 2 exemplifies that the substrate wiring 110 includes a main wiring 110a that crosses the first circuit 201 and the second circuit 202, and a sub-wiring 110b that is projected from the main wiring 110a and is electrically connected to the external wiring 120 and the input pad 210, but the present inventive concept is not limited thereto. The substrate wiring 110 is not limited to any particular shape, as long as the substrate wiring 110 electrically connects the first circuit 201 and the second circuit 202 to each other. As illustrated in FIG. 2, the substrate wiring 110 may be formed integrally with the external wiring 120.

The substrate wiring 110 may supply the power supply voltage VDD or the ground voltage VSS to the first circuit 201 and the second circuit 202. In this case, the input pad 210 connected to the substrate wiring 110 may be electrically connected to the external wiring 120 that supplies the power supply voltage or the ground voltage.

Hereinafter, referring to FIGS. 2 and 3, the relationship between the first circuit 201, the second circuit 202, and the substrate 110 will be described in more detail.

The semiconductor chip 200 includes the first circuit 201, the second circuit 202, and a connection pad 251, and the first circuit 201 and the second circuit 202 may include a first wiring structure 201a and a second wiring structure 202a, respectively. The first wiring structure 201a and the second wiring structure 202a may have a structure in which a plurality of wiring layers and a plurality of vias are alternately laminated and the wiring layers are connected through the vias. The connection pad 251 is an input/output node that is formed on one surface of the semiconductor chip 200 and is exposed to the outside to exchange electrical signals with the outside. The first wiring structure 201a and the second wiring structure 202a are electrically connected to the connection pad 251 through the respective vias. The first wiring structure 201a and the second wiring structure 202a are insulated from each other, and wiring for electrically connecting the structures to each other is not formed inside the semiconductor chip 200. A connection pad 251 may be provided for each of the first circuit 201 and the second circuit 202.

On the other hand, the substrate wiring 110, a passivation layer 130, and a contact 131 are formed on the substrate 100. The passivation layer 130 is formed on the substrate wiring 110 to cover the whole surface of the substrate 100, and includes the contact 131 that exposes a part of the substrate wiring 110. The contact 131 is electrically connected to the connection pad 251 through a contact pad 132. A contact 131 and a contact pad 132 may be provided for each of the first circuit 201 and the second circuit 202. Accordingly, the first wiring structure 201a and the second wiring structure 202a are electrically connected to the substrate wiring 110 by the connection pad 251, the contact pad 132 and the contact 131, and the first circuit 201 and the second circuit 202 are electrically connected to each other by the substrate wiring 110. FIG. 3 exemplifies that a conductor 261 is interposed between the connection pad 251 and the contact pad 132 to achieve a smooth contact between the connection pad 251 and the contact pad 132. Specifically, the conductor 261 may be, but is not limited to, a solder ball or the like. The conductor 261 is not limited to its shape or material as long as the conductor 261 can achieve a smooth contact between the connection pad 251 and the contact pad 132. The conductor 261 may be omitted.

In order to input diverse signals to the semiconductor chip 200, a plurality of internal wirings are used. Recently, as the size of the semiconductor chip is gradually decreased, the line width of the wirings formed inside the semiconductor chip becomes narrower, and this narrowing causes an increase of the wire resistance and an occurrence of signal interference. According to the semiconductor device according to the first exemplary embodiment, the wiring for connecting the circuits or the wiring for delivering signals to the circuits are not formed inside the semiconductor chip, but are formed on the substrate, and thus the line width between the internal wirings can be secured. Further, since a margin between the internal wirings is secured, signal interference between the wirings can be reduced. Further, since the substrate wiring 110 can be wider than the wiring inside the semiconductor chip, wire resistance is reduced.

FIG. 4 is a view schematically illustrating a semiconductor device mounted with a semiconductor chip according to the first exemplary embodiment. Referring to FIG. 4, the semiconductor device according to the first exemplary embodiment may be a liquid crystal display device or a display device such as an organic light emitting display device. The substrate 100 includes a display area 101 and a non-display area 102 that is formed around the display area 101, and the semiconductor chip 200 according to the first exemplary embodiment is mounted on the non-display area 102 of the substrate 100. Although not illustrated in the drawing, gate lines, data lines, thin film transistors, and pixel electrodes may be formed on the display area 101 of the substrate 100, and the wirings output from the output pad 120 of the semiconductor chip 200 are extended up to the display area 101 to serve as the gate lines and the data lines. Further, the semiconductor device according to this exemplary embodiment may further include an upper display plate which is opposite the substrate 100 and has a size that is smaller than that of the substrate 100. In this case, the semiconductor chip 200 may generate a driving signal for driving the display device to a driver IC. Further, the substrate wiring 110 may be, but is not limited to, a voltage wiring that supplies the power supply voltage or the ground voltage to the first circuit 201 and the second circuit 202.

Figure 5:
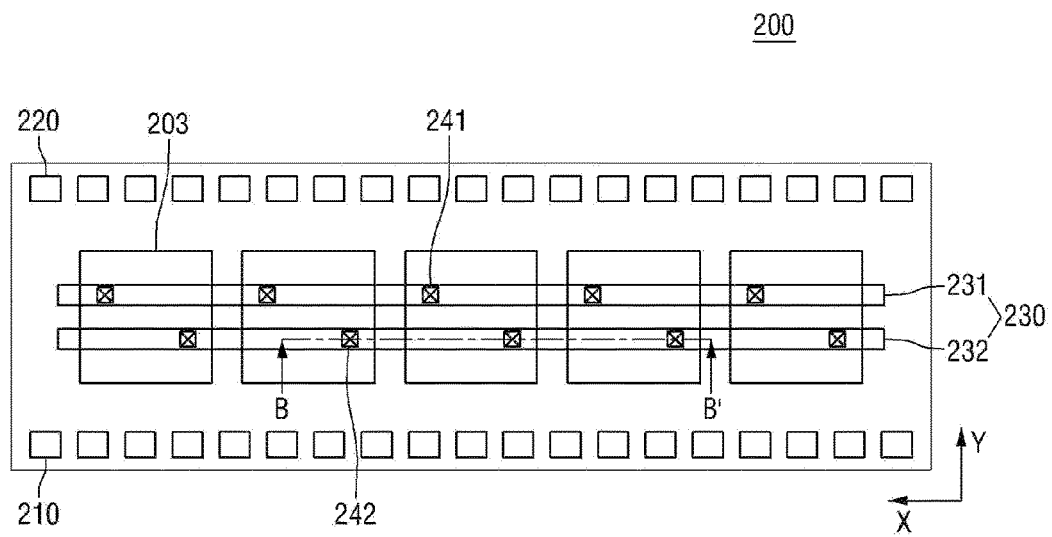
FIG. 5 is a layout diagram of a semiconductor chip included in a semiconductor device according to a second exemplary embodiment.
Figure 6:
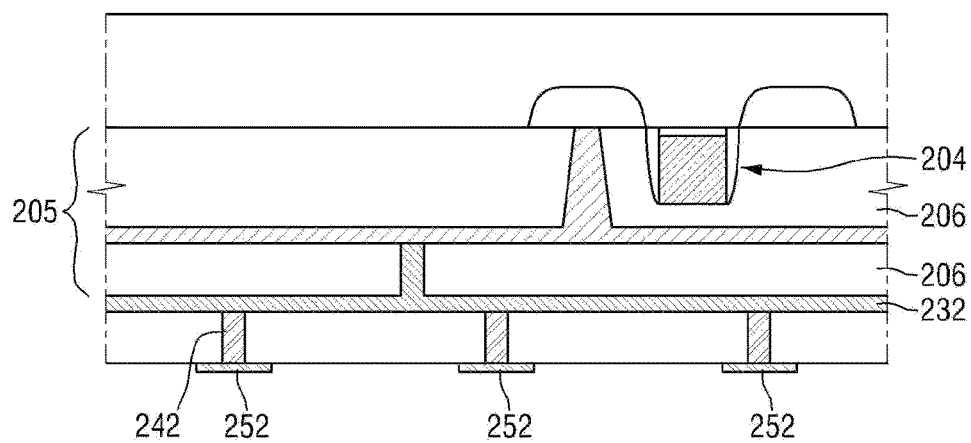
FIG. 6 is a cross-sectional view cut along line B-B' in FIG. 5.
Figure 7:
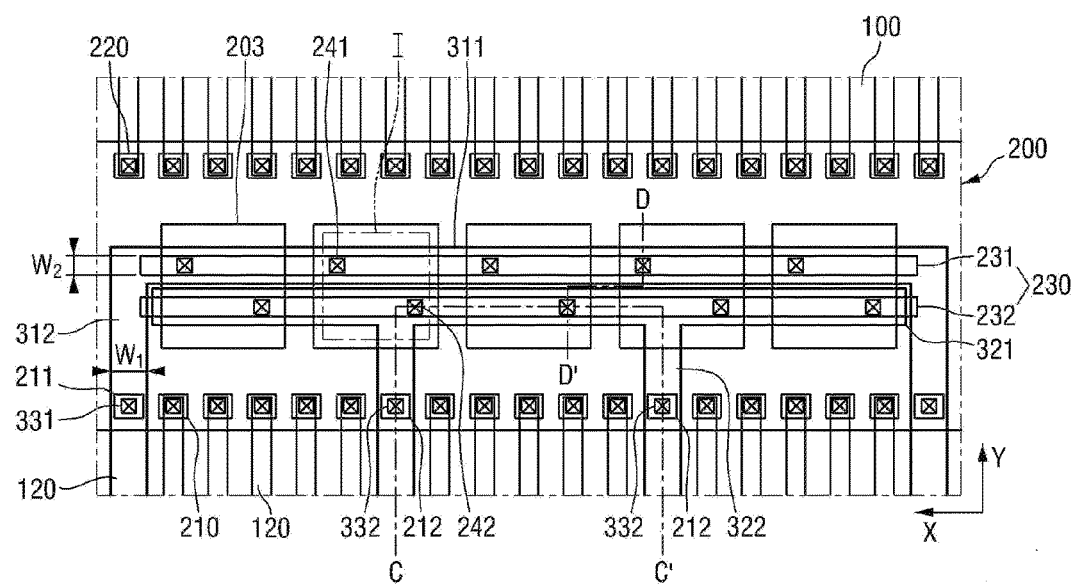
FIG. 7 is a layout diagram of a part of a substrate on which a semiconductor chip is mounted in a semiconductor device according to the second exemplary embodiment.
Figure 8:
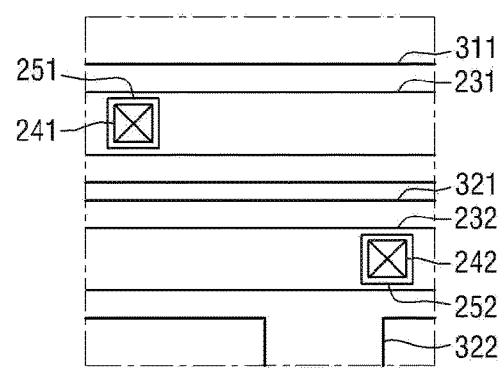
FIG. 8 is an enlarged view of an area I in FIG. 7.
Figure 9:
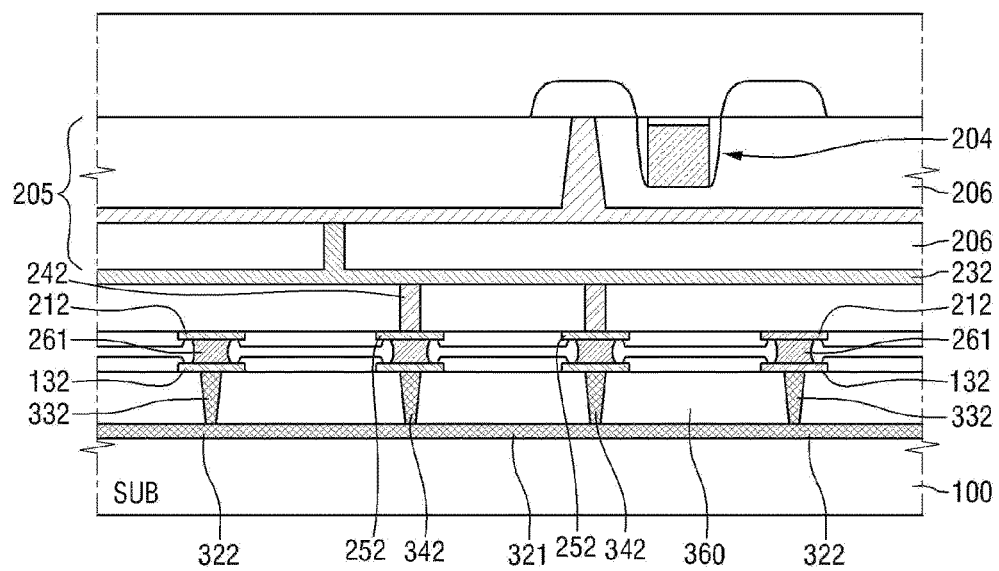
FIG. 9 is a cross-sectional view cut along line C-C' in FIG. 7.
Figure 10:
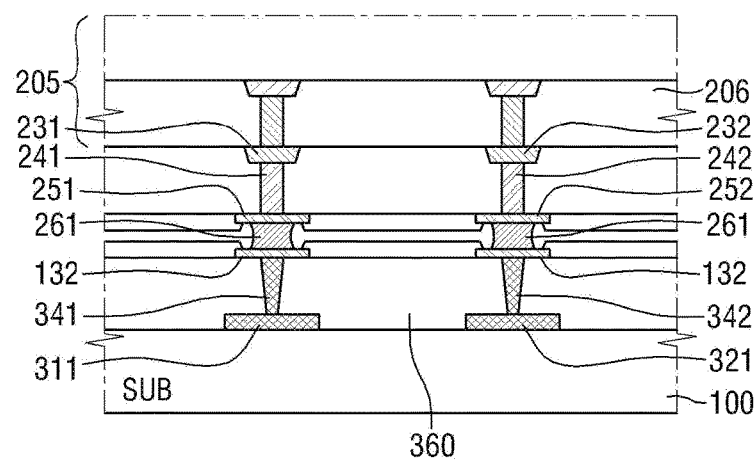
FIG. 10 is a cross-sectional view cut along line D-D' in FIG. 7.

Hereinafter, referring to FIGS. 5 to 10, a semiconductor device according to a second exemplary embodiment will be described. FIG. 5 is a layout diagram of a semiconductor chip included in a semiconductor device according to the second exemplary embodiment, and FIG. 6 is a cross-sectional view cut along line B-B' in FIG. 5. FIG. 7 is a layout diagram of a part of a substrate on which a semiconductor chip is mounted in a semiconductor device according to the second exemplary embodiment, and FIG. 8 is an enlarged view of an area I in FIG. 7. FIG. 9 is a cross-sectional view cut along line C-C' in FIG. 7, and FIG. 10 is a cross-sectional view cut along line D-D' in FIG. 7. The semiconductor device according to the second exemplary embodiment is different from the semiconductor device according to the first exemplary embodiment in that the internal wiring is formed inside the semiconductor chip and the internal wiring is electrically connected to the substrate wiring that is formed on the substrate. Hereinafter, the description will be made around this, the same reference numerals are used for the constituent elements substantially the same as those according to the first exemplary embodiment, and the detailed description thereof will be omitted.

First, referring to FIGS. 5, 6, and 8, the semiconductor chip 200 of the semiconductor device according to the second exemplary embodiment will be described. The semiconductor chip 200 includes a plurality of unit cells 203, a plurality of input pads 210, a plurality of output pads 220, an internal wiring 230, and a plurality of connection pads 251 and 252. The semiconductor chip 200 according to the second exemplary embodiment may have a long axis and a short axis, and referring to FIG. 5, the long axis direction is defined as an X direction, and the short axis direction is defined as a Y direction.

The plurality of unit cells 203 include circuits, and may generate output signals in response to the power supply signal or a drive control signal that is applied to the semiconductor chip 200 through the input pad 110 or the like.

The internal wiring 230 serves to supply signals to the plurality of unit cells 203, and at least one internal wiring 230 may be formed. Specifically, the internal wiring 230 includes a first internal wiring 231 and a second internal wiring 232 which are extended in parallel along the long axis direction of the semiconductor chip 200. Referring to FIG. 6, each of the plurality of unit cells 203 may include respective gate structures 204 and a wire structure 205 formed by laminating a plurality of wiring layers and a plurality of vias in interlayer insulating films 206, and the wiring structure 205 is electrically connected to the second internal wiring 232 through one or more vias. In the same manner, the first internal wiring 231 is electrically connected to the wiring structure of the unit cell 203 through one or more vias.

Referring to FIGS. 6 and 8, the first connection pad 251 and the second connection pad 252 may be formed to be exposed from one surface of the semiconductor chip 200 to the outside. The first connection pad 251 and the second connection pad 252 may be exposed to the outside to exchange electric signals with the outside. The second internal wiring 232 is electrically connected to the second connection pad 252 through the second via 242, and the first internal wiring 231 is electrically connected to the first connection pad 251 through the first via 241.

Referring again to FIG. 5, the input pad 210 and the output pad 220 are formed on one surface of the semiconductor chip 200 to be exposed to the outside, and at least one input pad and at least one output pad may be formed. The input pad 210 is formed to be spaced apart from the internal wiring 230, and for example, is formed in one end portion in the long axis direction of the semiconductor chip 200. The output pad 220 may be formed in the other end portion in the long axis direction that is opposite the one end portion.

Referring to FIG. 7, substrate wirings 311, 312, 321, and 322 and an external wiring 120 are formed on the substrate 100. The substrate wirings 311, 312, 321, and 322 are formed on the substrate 100, and include first substrate wirings 311 and 312 and second substrate wirings 321 and 322. The first substrate wirings 311 and 312 include a first sub-line 311 that is extended in the X direction in parallel with the first internal wirings 231 while overlapping the first internal wiring 231, and a second sub-line 312 that is projected from the first sub-line 311 and is connected to at least one of the first input pads 211. FIG. 7 exemplifies that the second sub-line 312 is extended from the first sub-line 311 in the Y direction and is electrically connected to the two first input pads 211, but the present inventive concept is not limited thereto. For example, the second sub-line 312 may be extended from the first sub-lines 311 in diverse forms, and may be connected to one, or three or more input pads 210. The second substrate wirings 321 and 322 include a third sub-line 321 that is extended in the X direction in parallel with the second internal wirings 232 while overlapping the second internal wiring 232, and a fourth sub-line 322 that is projected from the third sub-line 321 in the Y direction and is connected to at least one of the second input pads 212.

Further, the width $W_1$ of the first substrate wirings 311 and 312 may be wider than the width $W_2$ of the first internal wiring 231, and in the same manner, the width of the second substrate wirings 321 and 322 may be wider than the width of the second internal wiring 232. As already described above, the line width of the substrate wirings is set to be wider than that of the internal wiring, and thus the resistance is reduced.

The external wiring 120 is formed on the substrate 100 that is at one side of the semiconductor chip 200, and is connected to at least one of the plurality of input pads 210. The first substrate wirings 311 and 312 and the second substrate wirings 321 and 322 may be formed to be extended from the external wiring 200. That is, the external wiring 120 and the second substrate wirings 321 and 322 may be integrally formed with each other, and in the same manner, the external wiring 120 and the second substrate wirings 321 and 322 may be integrally formed with each other.

Hereinafter, referring to FIGS. 8 to 10, the relationship between the first internal wiring 231 and the second internal wiring 232, which are positioned inside the semiconductor chip 200, and the first substrate wirings 311 and 312 and the second substrate wirings 321 and 322, which are positioned on the substrate 100, will be described in detail.

The first connection pad 251 is formed on the first internal wiring 231, and the first internal wiring 251 and the first connection pad 251 are electrically connected to each other through the first via 241. A passivation layer 360 is formed on the substrate 100 to cover the first sub-line 311 and the second sub-line 312, and a first contact 341 is formed in the passivation layer 360 to expose the first sub-line 311. The first contact 341 is in contact with the contact pad 132, and the contact pad 132 is electrically connected to the first connection pad 251 through the conductor 262. Although FIGS. 9 and 10 illustrate the conductor 261 that is interposed between the contact pad 132 and the first connection pad 251 to achieve a smooth contact between the contact pad 132 and the first connection pad 251. The position of the conductor 261 is not limited thereto, and the conductor 261 may be omitted. In the same manner, the first internal wiring 231 and the first sub-line 311 are electrically connected to each other. The second sub-line 312 that is projected from the first sub-line 311 is connected to the first input pad 211 through the first input contact 331 that is formed in the passivation layer 360. (see FIG. 7). Accordingly, the first input pad 211, the second sub-line 312, the first sub-line 311, and the first internal wiring 231 are electrically connected to one another. In this case, the first substrate wirings 311 and 312 may be voltage wirings that supply the ground voltage or the power supply voltage to the first internal wiring 231.

In the same manner, the second connection pad 252 is formed on the second internal wiring 232, and the second internal wiring 232 and the second connection pad 252 are electrically connected to each other through the second via 242. The passivation layer 360 is formed on the substrate 100 to cover the third sub-line 321 and the fourth sub-line 322, and a second contact 342 is formed in the passivation layer 360 to expose the third sub-line 321. The second contact 342 is in contact with the contact pad 132, and the contact pad 132 is electrically connected to the second connection pad 252 through the conductor 261. Accordingly, the second internal wiring 232 is electrically connected to the third sub-line 321. The fourth sub-line 322 that is projected from the third sub-line 321 is electrically connected to the second input pad 212 through the second input contact 332 that is formed in the passivation layer 360. (see FIG. 7). Accordingly, the second internal wiring 232, the third sub-line 321, the fourth sub-line 322, and the second input pad 212 are electrically connected to one another. In this case, the second substrate wirings 321 and 322 may be voltage wirings that supply the ground voltage or the power supply voltage to the second internal wiring 232. For example, if the first substrate wirings 311 and 312 are power supply voltage wirings, the second substrate wirings 321 and 322 may be the ground voltage wirings.

According to the semiconductor device according to the second exemplary embodiment, wirings that supply voltage to the semiconductor chip are formed on the substrate in addition to the internal wirings that are formed inside the semiconductor chip, and thus the number of internal wirings that supply the voltage to the semiconductor chip can be reduced. Accordingly, the line width between the internal wirings can be secured, and the wire resistance can be reduced.

Further, the semiconductor device according to the second exemplary embodiment may be a display device as illustrated in FIG. 4. Specifically, the substrate 100 may be divided into a display area on which an image is displayed and a non-display area 102 that is formed around the display area, and the semiconductor chip 200 may be mounted on the non-display area. For example, in the case where the semiconductor device is a liquid crystal display device, gate lines, data lines, thin film transistors, and pixel electrodes may be formed on the display area of the substrate 100, and an upper display plate which is opposite the substrate 100 and has a size that is smaller than that of the substrate 100 may be laminated. In this case, a liquid crystal layer is interposed between the substrate 100 and the upper display plate.

Figure 11:
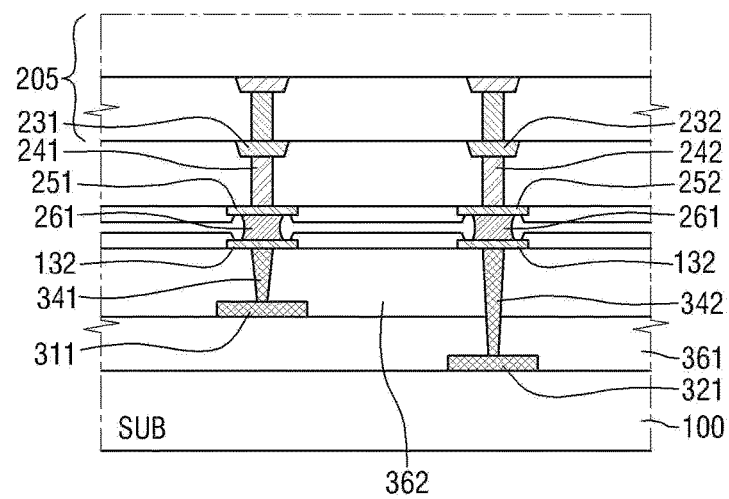
FIG. 11 is a cross-sectional view explaining a semiconductor device according to a third exemplary embodiment.

Hereinafter, referring to FIG. 11, a semiconductor device according to a third exemplary embodiment will be described. The semiconductor device according to the third exemplary embodiment is different from the semiconductor device according to the second exemplary embodiment in that the first substrate wiring and the second substrate wiring are positioned on different layers, and the description will be made around this point. In the semiconductor device according to the third exemplary embodiment, the layout diagram of a part of the substrate on which the semiconductor chip is mounted is the same as that of FIG. 7. FIG. 11 is a cross-sectional view cut along line D-D' in FIG. 7.

Referring to FIG. 11, the third sub-line 321 is formed on the substrate 100, and the first passivation layer 361 is formed to cover the third sub-line 321. The first sub-line 311 is formed on the first passivation layer 361. The second passivation layer 362 is formed on the first passivation layer 361 to cover the first sub-line 311. That is, the first sub-line 311 and the third sub-line 321 are positioned on different layers, and the first sub-line 311 and the second sub-line 321 are insulated from each other by the first passivation layer 361 and the second passivation layer 362. Accordingly, the first substrate wiring that includes the first sub-line 311 and the second substrate wiring that includes the third sub-line 321 exist on different layers. The second contact 342 that exposes the third sub-line 321 is formed to penetrate the first passivation layer 361 and the second passivation layer 362. If the first sub-line 311 and the third sub-line 321 exist on the different layers, the unlike the case illustrated in FIG. 7, the first sub-line 311 and the third sub-line 321 may be drawn to overlap each other.

Figure 12:
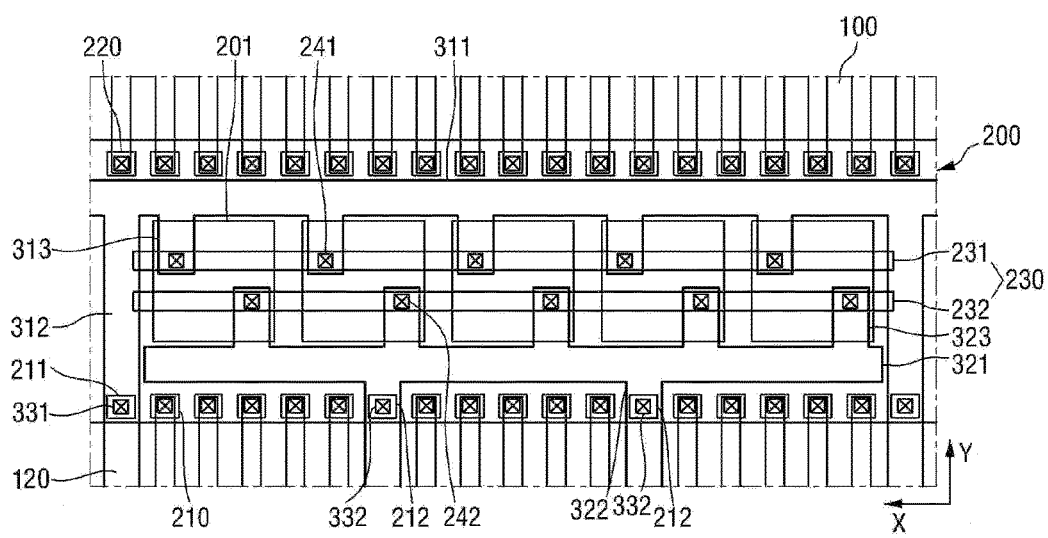
FIG. 12 is a layout diagram of a part of a substrate on which a semiconductor chip is mounted in a semiconductor device according to a fourth exemplary embodiment.

Hereinafter, referring to FIG. 12, a semiconductor device according to a fourth exemplary embodiment will be described. FIG. 12 is a layout diagram of a part of the substrate on which the semiconductor chip is mounted in the semiconductor device according to the fourth exemplary embodiment. The semiconductor device according to the fourth exemplary embodiment is different from the semiconductor device according to the second exemplary embodiment in that the first sub-line and the third sub-line do not overlap the first internal wiring and the second internal wiring, respectively, but are formed on the substrate on one side of the first internal wiring and the second internal wiring. Hereinafter, the description will be made around this point.

Referring to FIG. 12, the first substrate wirings 311, 312, and 313 are formed on the substrate 100, and include the first sub-line 311, the second sub-line 312, and the first connection line 313. Since the first sub-line 311 is formed to be extended in the X direction on the substrate 100 at one side of the first internal wiring 231, it does not overlap the first internal wiring 231. The second sub-line 312 is projected from the first sub-line 311 in the Y direction, and is electrically connected to the first input pad 211. The first connection line 313 is projected from the first sub-line 311 in the Y direction, and is electrically connected to the first internal wiring 231. The second sub-line 312 may be formed to be extended from the external wiring 120. That is, the first substrate wirings 311, 312, and 313 include the first sub-line 311, the second sub-line 312, and the first connection line 313, which are extended from the external wiring 120 to overlap the semiconductor chip 200, and the external wiring 120, the first sub-line 311, the second sub-line 312, and the first connection lime 313 may be integrally formed with one another.

In the same manner, the second substrate wirings 321, 322, and 323 are formed on the substrate 100, and includes the third sub-line 321, the fourth sub-line 322, and the second connection line 323. Since the third sub-line 321 is formed to be extended in the X direction on the substrate 100 at one side of the second internal wiring 232, it does not overlap the second internal wiring 232. The fourth sub-line 322 is projected from the third sub-line 321 in the Y direction, and is electrically connected to the second input pad 212. The second connection line 323 is projected from the third sub-line 321 in the Y direction, and is electrically connected to the second internal wiring 232. Further, the fourth sub-line 322 may be extended from the external wiring 120.

Figure 13:
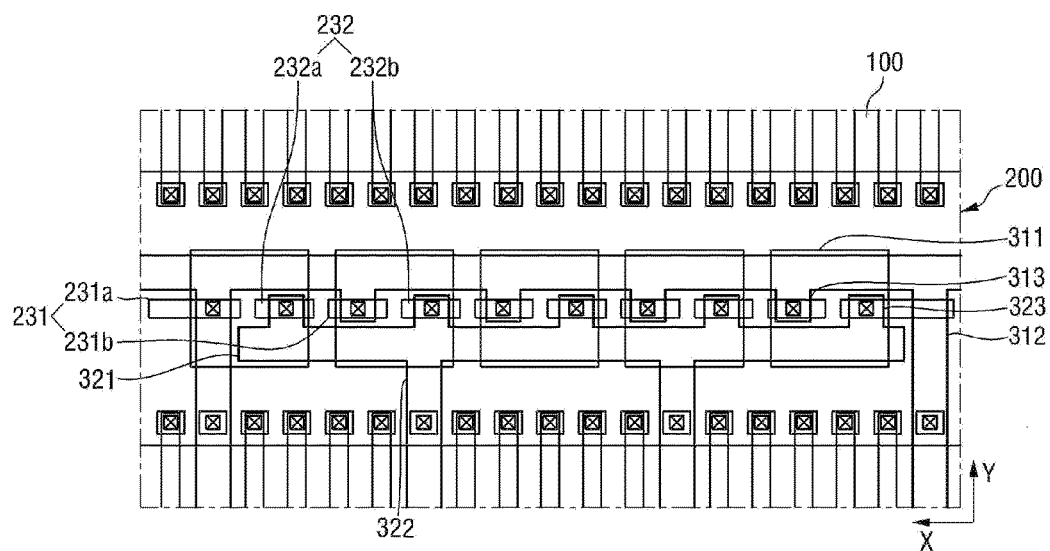
FIG. 13 is a layout diagram of a part of a substrate on which a semiconductor chip is mounted in a semiconductor device according to a fifth exemplary embodiment.

Hereinafter, referring to FIG. 13, a semiconductor device according to a fifth exemplary embodiment will be described. FIG. 13 is a layout diagram of a part of the substrate on which the semiconductor chip is mounted in the semiconductor device according to the exemplary fifth embodiment. The semiconductor device according to the fifth exemplary embodiment is different from the semiconductor device according to the second exemplary embodiment in that the first internal wiring and the second internal wiring are alternately arranged in a line. Hereinafter, the description will be made around this, and the detailed description of the constituent elements that are substantially the same as those according to the second exemplary embodiment will be omitted.

Referring to FIG. 13, the first internal wiring 231 includes plurality of first sub-patterns 231a and plurality of second sub-patterns 231b. The first sub-patterns 231a and the second sub-patterns 231b are arranged in a line to be spaced apart from each other, and are electrically connected to the first substrate wirings 311, 312, and 313.

The second internal wiring 232 includes plurality of third sub-patterns 232a and plurality of fourth sub-patterns 232b. The third sub-patterns 232a and the fourth sub-patterns 232b are arranged in a line to be spaced apart from each other, and are electrically connected to the second substrate wirings 321, 322, and 323.

The first substrate wirings 311, 312, and 313 include the first sub-line 311 that is extended in the X direction, the second sub-line 312 that is projected from the first sub-line 311 and is connected to the first input pad, and the first connection line 313 that is projected from the first sub-line 311 and is connected to the first internal wiring 231. The second substrate wirings 321, 322, and 323 include the third sub-line 321 that is extended in the X direction, the fourth sub-line 322 that is projected from the third sub-line 321 and is connected to the second input pad, and the second connection line 323 that is projected from the third sub-line 321 and is connected to the second internal wiring 232. Although FIG. 13 exemplifies a case where the first sub-line 311 is arranged on the substrate 100 at one side of the first internal wiring 231 and the second internal wiring 232, and the third sub-line 321 is formed on the substrate 100 at the other side of the first internal wiring 231 and the second internal wiring 232, the present inventive concept is not limited thereto. Any one of the first sub-line 311 and the third sub-line 321 may be formed to overlap the first internal wiring 231 and the second internal wiring 232, and the remainder may be formed on the substrate 100 at one side of the first internal wiring 231 and the second internal wiring 232. Further, in the case where the first substrate wirings 311, 312, and 313 and the second substrate wirings 321, 322, and 323 are formed on different layers, the first sub-line 311 and the third sub-line 321 may be formed to overlap the first internal wiring 231 and the second internal wiring 232.

Figure 14:
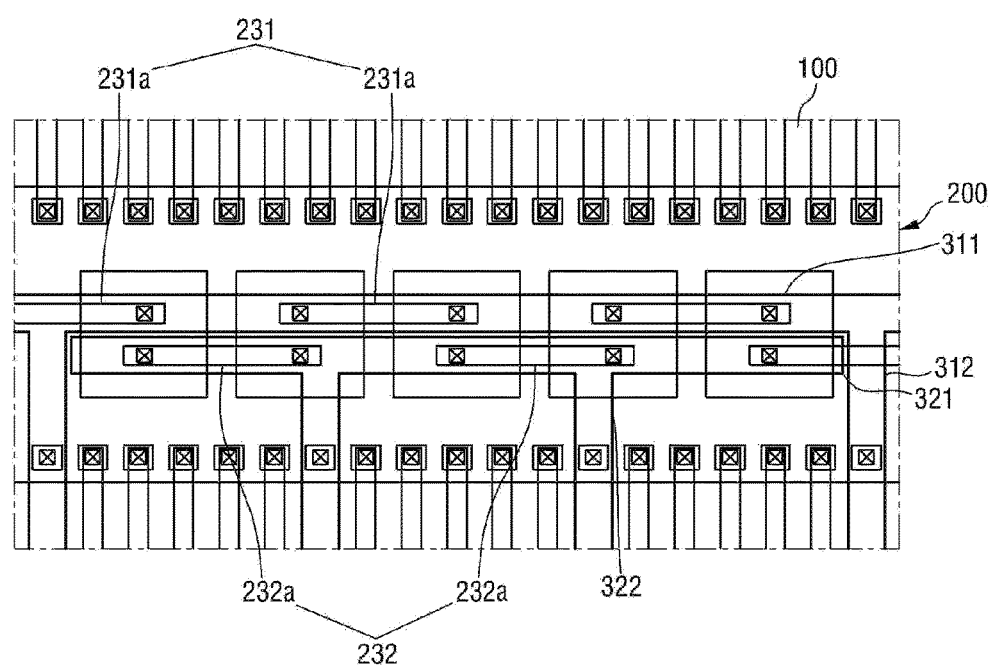
FIG. 14 is a layout diagram of a part of a substrate on which a semiconductor chip is mounted in a semiconductor device according to a sixth exemplary embodiment.

Hereinafter, referring to FIG. 14, a semiconductor device according to a sixth exemplary embodiment will be described. FIG. 14 is a layout diagram of a part of the substrate on which the semiconductor chip is mounted in the semiconductor device according to the sixth exemplary embodiment. The semiconductor device according to the sixth exemplary embodiment is different from the semiconductor device according to the second exemplary embodiment in that the first internal wiring and the second internal wiring are arranged in a zigzag manner. Hereinafter, the description will be made around this, and the detailed description of the constituent elements that are substantially the same as those according to the second exemplary embodiment will be omitted.

Referring to FIG. 14, the semiconductor chip 200 includes the first internal wiring 231 and the second internal wiring 232. The first internal wiring 231 includes a plurality of first sub-patterns 231a and the plurality of first sub-patterns 231a are arranged in a line in the X direction to be spaced apart from each other. The second internal wiring 232 includes a plurality of third sub-patterns 232a, and the plurality of third sub-patterns 232a are arranged in a line in the X direction to be spaced apart from each other. The first sub-patterns 232a and the third sub-patterns 232a are extended in a line in the X direction, and are arranged in a zigzag manner with each other.

The substrate 100 includes the first substrate wirings 311 and 312 and the second substrate wirings 321 and 322 which are formed on the substrate 100. The first substrate wirings 311 and 312 include the first sub-line 311 that overlaps the first sub-patterns 231a and is extended in the X direction, and the second sub-line 312 that is projected from the first sub-line 311 and is connected to the first input pad. The second substrate wirings 321 and 322 include the third sub-line 321 that overlaps the third sub-patterns 232a and is extended in the X direction, and the fourth sub-line 322 that is projected from the third sub-line 321 and is electrically connected to the second input pad.

Further, although not illustrated in the drawings, the first sub-line 311 may be formed at one side of the first internal wiring 231, and the third sub-line 321 may be formed at one side of the second internal wiring 232.

Although exemplary embodiments have been described for illustrative purposes, those skilled in the art will appreciate that various modifications, additions and substitutions are possible, without departing from the scope and spirit of the inventive concept as disclosed in the accompanying claims.

What is claimed is:

1. A semiconductor device comprising:
   a semiconductor chip comprising a first internal wiring, a first connection pad that is electrically connected to the first internal wiring and exposed to an outside of the semiconductor chip, and a first input pad that is spaced apart from the first connection pad;
   a substrate on which the semiconductor chip is disposed; and
   a first substrate wiring that is arranged on the substrate and electrically connects the first connection pad and the first input pad to each other,
   wherein the semiconductor chip further comprises:
      a second internal wiring that is spaced apart from the first internal wiring and extends in parallel to the first internal wiring;
      a second connection pad that is electrically connected to the second internal wiring and exposed to outside; and
      a second input pad that is spaced apart from the second connection pad, and
   wherein the semiconductor device further comprises a second substrate wiring that is arranged on the substrate and electrically connects the second connection pad and the second input pad to each other.

2. The semiconductor device of claim 1, wherein the first substrate wiring comprises:
   a first sub-line that extends along the first internal wiring; and
   a second sub-line that extends from the first sub-line and is electrically connected to the first input pad.

3. The semiconductor device of claim 2, wherein the first sub-line overlaps the first internal wiring.

4. The semiconductor device of claim 2,
   wherein the second substrate wiring includes a third sub-line extended in parallel to the first sub-line, and a fourth sub-line extended from the third sub-line and electrically connected to the second input pad.

5. The semiconductor device of claim 4, wherein the first sub-line and the third sub-line extend in a first direction; and
   the second sub-line and the fourth sub-line extend in a second direction that is perpendicular to the first direction.

6. The semiconductor device of claim 2, further comprising an external wiring that is formed on the substrate at one side of the semiconductor chip and is electrically connected to the first input pad;
   wherein the second sub-line extends from the external wiring.

7. The semiconductor device of claim 1, wherein the first internal wiring comprises a plurality of first sub-patterns which are spaced apart from one another and are arranged in a line in a first direction, and
   wherein the plurality of first sub-patterns are electrically connected to the first substrate wiring.

8. The semiconductor device of claim 7, wherein the second internal wiring has a plurality of second sub-patterns which are spaced apart from one another, arranged in a line in the first direction, and alternately arranged with the plurality of first sub-patterns.

9. The semiconductor device of claim 7, wherein the second internal wiring has a plurality of second sub-patterns which are spaced apart from one another, arranged in a line in the first direction, and arranged in a zigzag manner with the plurality of first sub-patterns.

10. The semiconductor device of claim 1, wherein the semiconductor chip has a long axis in a first direction and a short axis in a second direction that is perpendicular to the first direction;
    wherein the first internal wiring extends along the first direction.

11. The semiconductor device of claim 1, wherein the substrate includes a display area on which an image is displayed and a non-display area around the display area;

the semiconductor chip is disposed on the non-display area; and the semiconductor chip is a driving chip.

12. A semiconductor device comprising:
a substrate;
a semiconductor chip mounted on the substrate, the semiconductor chip comprising:
  a plurality of unit cells spaced apart from one another;
  a plurality of input pads;
  a first internal wiring electrically connected to each of the plurality of unit cells;
  a second internal wiring electrically connected to each of the plurality of unit cells, the second internal wiring spaced apart from the first internal wiring;
  a first connection pad exposed on a surface of the semiconductor chip and electrically connected to the first internal wiring; and
  a second connection pad exposed on the surface of the semiconductor chip and electrically connected to the second internal wiring;
a first substrate wiring formed on the substrate that electrically connects the first connection pad to at least one first input pad of the plurality of input pads; and
a second substrate wiring formed on the substrate that electrically connects the second connection pad to at least one second input pad of the plurality of input pads.

13. The semiconductor device of claim 12, wherein:
the plurality of unit cells are spaced apart from one another in a first direction;
the first internal wiring extends in parallel to the plurality of unit cells in the first direction; and
the second internal wiring extends in parallel to the first internal wiring.

14. The semiconductor device of claim 12, wherein:
the first internal wiring extends in a first direction;
the first substrate wiring comprises a first sub line that extends in the first direction and is electrically connected to the first connection pad, and a second sub line that is electrically connected to the first sub line, extends in a second direction perpendicular to the first direction, and is electrically connected to the at least one first input pad.

15. The semiconductor device of claim 14, wherein:
the second internal wiring extends in the first direction;
the second substrate wiring comprises a third sub line that extends in the first direction and is electrically connected to the second connection pad, and a fourth sub line that is electrically connected to the third sub line, extends in the second direction, and is electrically connected to the at least one second input pad.

16. The semiconductor device of claim 12, wherein:
the first internal wiring comprises a plurality of first sub-patterns arranged along a first line and spaced apart from each other, the plurality of first sub-patterns of the first internal wiring being electrically connected to the first substrate wiring;

the second internal wiring comprises a plurality of second sub-patterns arranged along a second line spaced apart from each other, the plurality of second sub-patterns of the second internal wiring being electrically connected to the second substrate wiring;
the first line and the second line extend in a first direction, and the second line extends parallel to the first line; and
a second sub-pattern of the second internal wiring overlaps a portion of each of two adjacent first sub-patterns of the first internal wiring in a second direction which is perpendicular to the first direction.

17. The semiconductor device of claim 16, wherein:
the first substrate wiring comprises:
  a first sub line that extends in the first direction and is electrically connected to the first connection pad and the plurality of first sub-patterns of the first internal wiring, and
  a second sub line that is electrically connected to the first sub line, extends in the second direction, and is electrically connected to the at least one first input pad.

18. The semiconductor device of claim 17, wherein:
the second substrate wiring comprises:
  a third sub line that extends in the first direction and is electrically connected to the second connection pad and the plurality of second sub-patterns of the second internal wiring, and
  a fourth sub line that is electrically connected to the third sub line, extends in the second direction, and is electrically connected to the at least one second input pad.

19. A semiconductor device comprising:
a substrate;
a semiconductor chip mounted on the substrate, the semiconductor chip comprising:
  a plurality of unit cells spaced apart from one another;
  a plurality of input pads arranged along an edge of the semiconductor chip and spaced apart from one another;
  a first internal wiring electrically connected to each of the plurality of unit cells;
  a second internal wiring electrically connected to each of the plurality of unit cells, the second internal wiring spaced apart from the first internal wiring;
a first substrate wiring formed on the substrate that electrically connects the first internal wiring to a first input pad and a second input pad of the plurality of input pads; and
a second substrate wiring formed on the substrate that electrically connects the second internal wiring to at least one input pad of the plurality of input pads that is arranged between the first input pad and the second input pad.

* * * * *